(12) United States Patent
Pelley

(10) Patent No.: US 7,791,367 B1
(45) Date of Patent: Sep. 7, 2010

(54) DRIVER WITH SELECTABLE OUTPUT IMPEDANCE

(75) Inventor: Perry H. Pelley, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/479,093

(22) Filed: Jun. 5, 2009

(51) Int. Cl.
*H03K 17/16* (2006.01)
*H03K 19/003* (2006.01)

(52) U.S. Cl. .............................. 326/30; 326/32; 326/34; 326/87

(58) Field of Classification Search ........................ None
See application file for complete search history.

(56) References Cited

U.S. PATENT DOCUMENTS

| | | | |
|---|---|---|---|
| 5,606,275 A | 2/1997 | Farhang et al. | |
| 6,570,402 B2 | 5/2003 | Koo et al. | |
| 6,839,286 B2 * | 1/2005 | Cho et al. | 365/189.05 |
| 7,642,808 B2 * | 1/2010 | Jeong et al. | 326/30 |

OTHER PUBLICATIONS

"Micron MT54V512H18EF-10 9Mb QDR SRAM Circuit Analysis"; May 14, 2002; Cover page, copyright information & 1 page: Chipworks, Inc. USA.

\* cited by examiner

*Primary Examiner*—Anh Q Tran
(74) *Attorney, Agent, or Firm*—James L. Clingan, Jr.; Robert L. King

(57) ABSTRACT

An integrated circuit is configured to be in a calibration mode of operation to establish a desired output impedance of a driver circuit. A predetermined constant voltage is established at a circuit node within the integrated circuit. A calibration current is conducted through a transistor connected in series with a variable value resistance in the integrated circuit at the circuit node. A resistance value of the variable value resistance is varied to establish a value of the calibration current which establishes the desired output impedance. The calibration mode is exited and a functional mode is entered. A calibrated resistance value is used during the functional mode of operation. The calibration current is conducted as a calibrated current through the transistor and calibrated resistance value. Variation of the calibrated current is corrected in response to voltage and process variations to maintain the calibrated current and output impedance of the driver circuit.

20 Claims, 5 Drawing Sheets

US 7,791,367 B1

DRIVER WITH SELECTABLE OUTPUT IMPEDANCE

BACKGROUND

1. Field

This disclosure relates to output drivers, and more particularly to output drivers with selectable output impedance.

2. Related Art

As speeds continue to increase in integrated circuits, the issues relating to termination of the inputs and outputs are becoming more significant. For example, an output of an output driver of an integrated circuit can, at very high speeds, ring if the output impedance does not properly correspond to the input impedance of the circuit that it drives. The necessary control of the output impedance is difficult to achieve with an integrated circuit because of the variations in circuit performance caused by variations in processing. One technique has been for the output driver to have a variable output impedance that is selected to be a particular value. With the value being known with sufficient accuracy, the output can be terminated with an impedance that avoids the ringing. There are a variety of known output drivers with variable output impedance that allow for selection of a desired output impedance. One of the continuing issues is in providing a technique that selects the output impedance. In a typical case, the selection process and the ultimate operation of the output driver require an external resistor. The resistor is external because it needs to be precise in its value and not vary with temperature. Due to process variations, resistors on integrated circuits are not generally available with sufficient precision as to its value. The use of the precision resistor, however, does not completely alleviate issues relating to process variation. The output impedance, even though derived from a precision resistor, is still subject to process variations causing differences in transistor characteristics and corresponding differences in circuit performance. Circuit techniques can be used to reduce the differences in circuit performance but they are difficult to completely remove. Thus, the provided output impedance may still vary from what is desired.

Thus there is a need for an output driver with a desired output impedance that overcomes or improves upon one or more of the issues raised above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, an output driver uses an internal variable resistor that has been calibrated to a certain value that is used by the output driver to provide a desired output impedance. Because the output impedance is measured in the selection of the resistance, the selected resistance can be used to very accurately achieve the desired output impedance. This is better understood by reference to the following description and the drawings.

Figure 1:
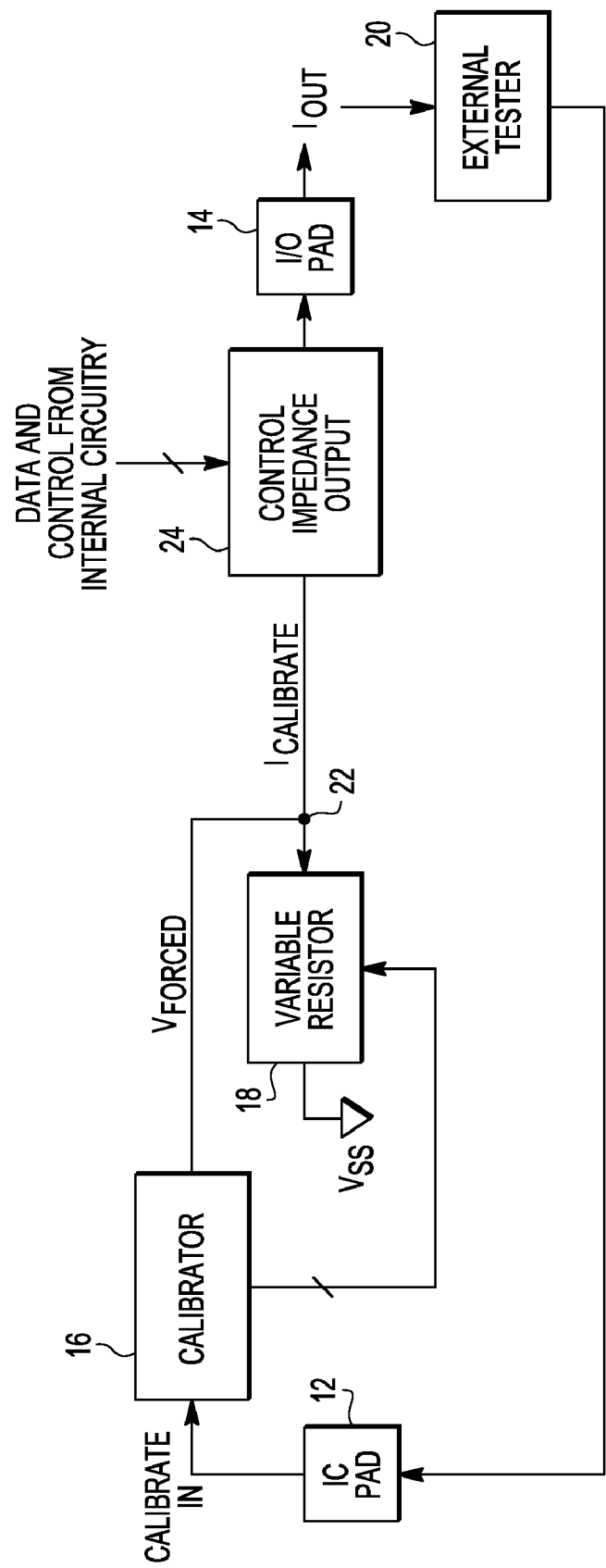
FIG. 1 is a block diagram of a system for use in obtaining an output driver with a desired output impedance according to an embodiment.

Shown in FIG. 1 is a system 10 comprising an integrated circuit (IC) pad 12, an input/output (I/O) pad 14, a calibrator 16, a variable resistor 18, an external tester 20, a node 22, and a controlled-impedance output circuit 24. IC pad 12, I/O pad 14, calibrator 16, variable resistor 18, node 22, and controlled-impedance output circuit 24 are part of a single integrated circuit. External tester 20 is external to the integrated circuit. IC pad 12 is connected to calibrator 16 and external tester 20. Calibrator 16 has an input connected to node 22, a bias output connected to node 22, and a calibrate output connected to a control input of variable resistor 18. Variable resistor 18 is connected to node 22 and to a negative power supply terminal VSS. VSS in this example is ground but could be for another potential. VSS is for being at a voltage lower than a positive power supply terminal commonly referenced as VDD although not shown in FIG. 1. Controlled-impedance output circuit 24 has a current output connected to node 22, a data input for receiving data and control signals from circuitry internal to the integrated circuit, and an output coupled to I/O pad 14. External tester 20 has an input connected to I/O pad 14 and an output connected to IC pad 12.

In operation calibrator 16 sets a resistance for variable resistor 18, based on an input from external tester 20, forces a voltage at node 22 where variable resistor 18 draws current $I_{calibrate}$ from controlled-impedance output circuit 24. Current $I_{calibrate}$ controls an output impedance of controlled-impedance output circuit 24. Tester 20 draws current from controlled-impedance output circuit 24 at a voltage of half the voltage at VDD (½ VDD) and measures the current at the voltage of ½ VDD. Knowing the current and the voltage allows for knowing the output impedance. If the output impedance is a desired output impedance, testing is complete and the resistance of variable resistor 18 may be set either temporarily or permanently. If the output impedance is not the desired output impedance, external tester 20 changes the input to calibrator 16 to cause calibrator 16 to change the resistance of variable resistor 18. Tester 20 again tests the output impedance of controlled-impedance output circuit 24. This process continues until the desired output impedance is achieved and the input to variable resistance 18 is stored.

Figure 2:
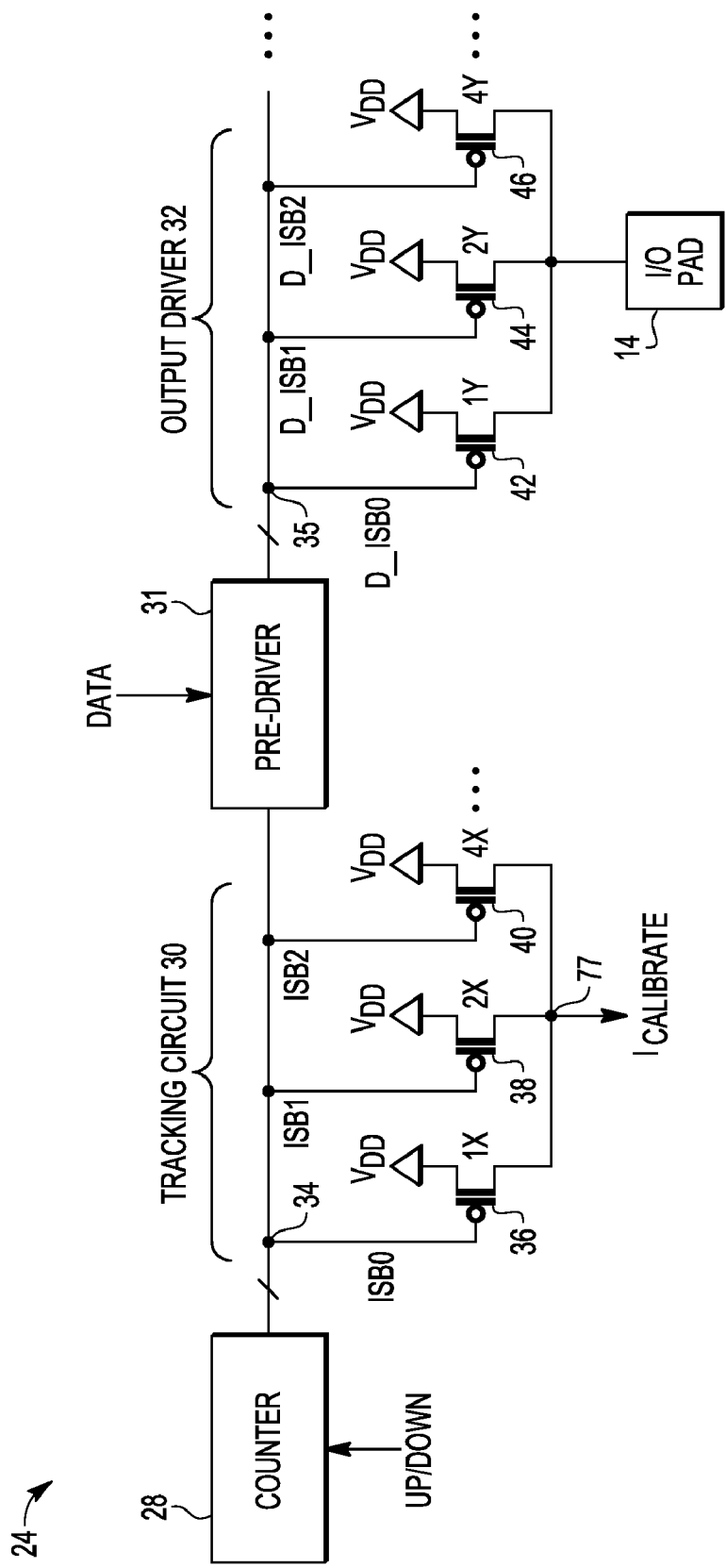
FIG. 2 is a combination block diagram and circuit diagram of a first portion of the system of FIG. 1.

Shown in FIG. 2 is controlled-impedance output circuit 24 of FIG. 1 in more detail. As shown in FIG. 2, controlled-impedance output circuit 24 comprises a counter 28, a tracking circuit 30, a pre-driver 31, and an output driver 32. Tracking circuit 30 comprises P channel transistors 36, 38, 40 and others not shown. Output driver 32 comprises transistors 42, 44, 46, and others not shown. Transistor 36 has a source connected to VDD, a gate coupled to an impedance select bit ISB0 of an output 34 of counter 28, and a drain connected to a node 77. Transistor 38 has a source connected to VDD, a gate coupled to an impedance select bit ISB1 of output 34 of counter 28, and a drain connected to node 77. Transistor 40 has a source connected to VDD, a gate coupled to an impedance select bit ISB2 of output 34 of counter 28, and a drain connected to node 77. Bit ISB0 is the least significant bit and bits ISB1 and ISB2 are next in ascending order of significance. Bits ISB0, ISB1, ISB2, and the additional bits of output 34 are active low. The transistors of tracking circuit 30 are sized by current drive capability in ascending order, doubling with each bit as indicated by 1x, 2, x, and 4x. This may be called binary weighting. The sizing for a given transistor can be achieved with multiple transistors in parallel or in series. Pre-driver 31 has an impedance select input for receiving output 34, a data input for receiving a data signal, and an output 35 for providing data/impedance bits, which are active low, such as D_ISB0, D_ISB1, and D_ISB2. Additional data/impedance signals are also provided corresponding to output 34. Transistor 42 has a source connected to VDD, a gate coupled to bit D_ISB0 of output 35 of pre-driver 31, and a drain connected to I/O pad 14. Transistor 44 has a source connected to VDD, a gate coupled to bit D_ISB1 of output 35, and a drain connected to I/O pad 14. Transistor 40 has a source connected to VDD, a gate coupled to bit D_ISB2 of output 35, and a drain connected to I/O pad 14. The transistors of tracking circuit 30 are sized in ascending order of current drive capability, doubling with each bit as indicated by 1y, 2, y, and 4y. The next is 8y. Y and X have a fixed size ratio in which Y is bigger than X. Transistors 36, 38, and 40 thus each have the same ratio, which is X to Y, to transistors 42, 44, and 46, respectively.

In operation current $I_{calibrate}$ is drawn from tracking circuit 30. Counter 28 has an output set to a nominal value such as half of its maximum count value during calibration. The nominal value thus sets the impedance of tracking circuit 30. Pre-driver 31 combines output 34 with the data signal to provide an active low signal for each active low bit provided by output 35 when the data signal is asserted. Thus, if the data signal is a logic high and bit ISB0 is a logic low (asserted), then pre-driver 31 provides bit D_ISB0 as a logic low (asserted). If the data signal is a logic low (deasserted), then all of the bits of output 35 that are provided to output driver 32 are a logic high (deasserted). For the case of the data signal being asserted, the impedance of output driver 32 and the impedance of tracking circuit have a ratio based upon the ratio of X to Y. Output driver 32 is for providing the logic high output on I/O pad 14. Transistors such as transistors 42, 44, and 46 are non-conductive when the data signal is a logic low. A logic low on I/O pad 14 is provided by N channel transistors that are not shown in FIG. 2.

Figure 3:
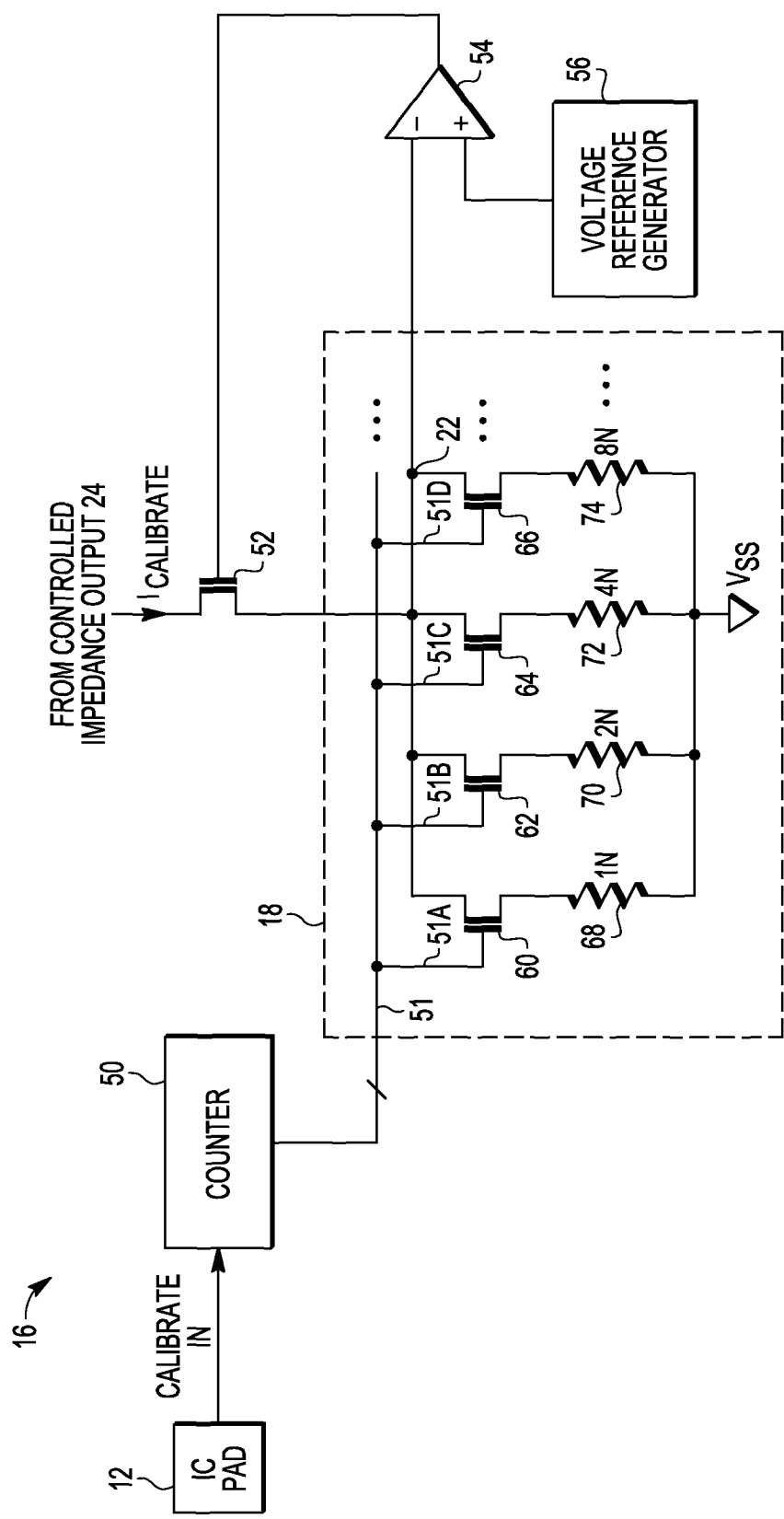
FIG. 3 is a combination block diagram and circuit diagram of a second portion of the system of FIG. 1.

Shown in FIG. 3 is calibrator 16 and variable resistor 18 according to a calibration configuration. Calibrator 16 comprises counter 50 having a multi-bit output 51, an N channel transistor 52, a high gain amplifier 54, and a voltage reference circuit 56 that is constant over process, voltage, and temperature variations. Variable resistor 18 comprises N channel transistors 60, 62, 64, 66, and others not shown and resistors 68, 70, 72, 74, and others not shown. Transistor 60 has a gate connected to a signal 51A that is one of the bits of multi-bit output 51, a drain connected to node 22, and a source. Resistor 68 has a first terminal connected to the source of transistor 60 and a second terminal connected to VSS. Transistor 62 has a gate connected to signal 51B, a drain connected to node 22, and a source. Resistor 70 has a first terminal connected to the source of transistor 62 and a second terminal connected to VSS. Transistor 64 has a gate connected to signal 51C, a drain connected to node 22, and a source. Resistor 72 has a first terminal connected to the source of transistor 64 and a second terminal connected to VSS. Transistor 66 has a gate connected to signal 51D, a drain connected to node 22, and a source. Resistor 74 has a first terminal connected to the source of transistor 66 and a second terminal coupled to VSS. Resistors 68, 70, 72, and 74 are sized in ascending order, doubling with each bit as indicated by 1n, 2n, 4n, and 8n. Transistors 60, 62, 64, and 66 form transistor/resistor pairs with resistors 68, 70, 72, 74, respectively. The additional transistors and resistors are similarly connected in transistor/resistor pairs, and the resistors continue the doubling with each additional transistor/resistor pair in the manner of binary weighting.

Counter 50 has an input coupled to IC pad 12, and an output coupled to multi-bit output 51 which may also be a bus of variable resistor 18. Transistor 52 has a drain for drawing calibration current $I_{calibrate}$, a source coupled to node 22 of variable resistor 18, and a gate. Amplifier 54 has an inverting input coupled to node 22, an output coupled to the gate of transistor 52, and a non-inverting input coupled to voltage reference generator 56.

In a calibration mode, transistor 52 causes node 22 to be a voltage equal to the output of voltage reference generator 56, which is a reference voltage, due to the high gain of amplifier 54. Thus for any calibration current $I_{calibrate}$ the voltage one node 22 is the reference voltage or at least very close to it. For a given output of counter 50 a resistance of variable resistor 18 is set which in turn sets a calibration current $I_{calibrate}$. The data is asserted to pre-driver 31 with counter 28 providing a nominal output. Under those conditions, tester 20 is used to draw current through output driver 32 until a predetermined voltage, such as ½ VDD, is reached at I/O pad 14. The tester thus can calculate the output impedance of output driver 32. For calibrating, counter output 51 is varied and the output impedance of output driver 32 is measured until the desired output impedance of output driver 32 is obtained. When such a state is determined, output 51 is stored, in a register for example. The counter output, which is considered to have a count value, is the count value at which variable resistor 18 is set that determines the calibration current $I_{calibrate}$ that establishes the desired output impedance for output driver 32 with a known voltage, the reference voltage, at node 22 and with the output of counter 28 at a nominal value. This count value of counter 50 obtained by experiment that achieves the desired output impedance is called the calibration count value. The corresponding calibration current $I_{calibrate}$ is called the reference current. This is also measured for the case of the output of output driver on I/O pad 14 being at ½ VDD.

Figure 4:
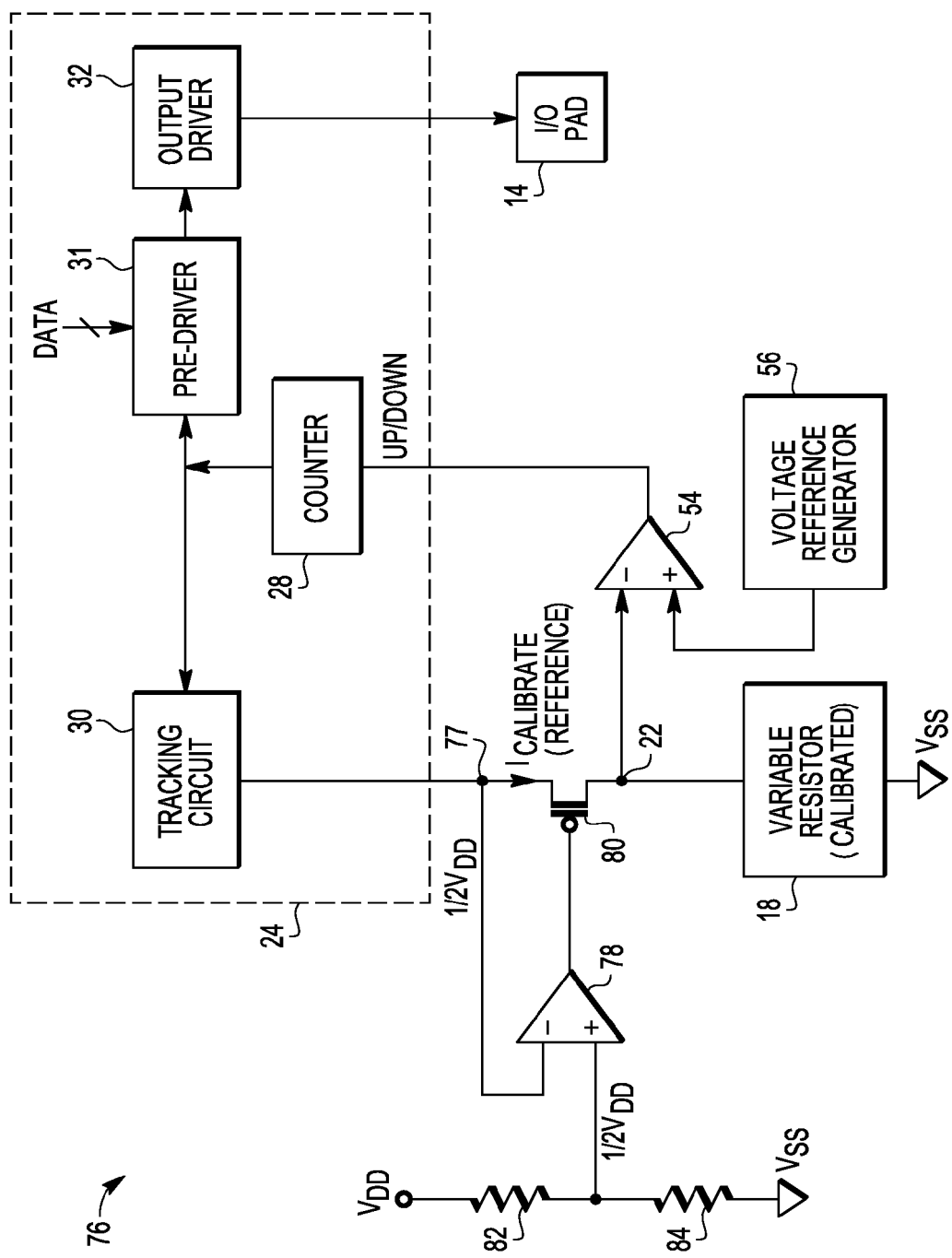
FIG. 4 is a block diagram of an output driver obtained using the system of FIG. 1.

Shown in FIG. 4 is a normal operation configuration 76 for providing data on I/O pad 14 during normal operation. Configuration 76 comprises controlled-impedance output circuit 24, variable resistor 18, amplifier 54, voltage reference generator 56, a P channel transistor r80, a high gain amplifier 78, a resistor 82, and a resistor 84. Controlled-impedance output circuit 24 is configured the same as shown in FIG. 2. Amplifier 54 has its inverting input coupled to node 22, its non-inverting input coupled to receive the reference voltage from reference voltage generator 56, and an output coupled to counter 28 for toggling the output of counter 28. Amplifier 54 functions as a comparator in configuration 76. Variable resistor 18 is set by the calibration count value so that variable resistor 18 has the calibrated resistance. Transistor 80 has a drain coupled to variable resistor 18 at node 22, a source coupled to tracking circuit 30 at node 77, and a gate. Resistor 82 has a first terminal coupled to VDD and a second terminal. Resistor 84 has a first terminal coupled to VSS and a second terminal coupled to the second terminal of resistor 82. Amplifier 78 has an inverting input coupled to the source of transistor 80, a non-inverting input coupled to the second terminals of resistors 82 and 84, and an output coupled to the gate of transistor 80. Resistors are made to have the same resistance so that the second terminals of resistors 82 and 84 is at ½ VDD. Resistors 82 and 84 are on the same integrated circuit as the other elements shown in FIG. 4. The actual values of resistors 82 and 84 may be difficult to control in an integrated circuit manufacturing process but making them the same resistance is relatively easy. The feedback from transistor 80 keeps the inverting input at ½ VDD and thus node 77 at ½ VDD. Counter 28 is initially set at the nominal value. A current near the reference current is the initial current which causes a voltage across variable resistor 18. If the initial current causes the voltage at node 22 to exceed the reference voltage, a logic low is output which causes counter 28 to count down on a next clock cycle. The clock on which configuration 76 operates is not shown as being well understood in the art. The counter counting down increases the impedance of tracking circuit 30 and thus reduces the current though variable resistor 18 and thus reduces the voltage on node 22. This continues for each subsequent clock cycle until node 22 is at a lower voltage than the reference voltage which will result in a logic high output from amplifier 54 which will cause counter 28 to count up and thus decrease the impedance of tracking circuit 30, thereby reducing the voltage on node 22. The output of amplifier 54 may simply toggle between a logic low and a logic high as the steady state. To avoid the frequent toggling, an alternative is, after the output of amplifier 54 switches states, disabling any changes in the counter for some number of clock cycles. In the steady state condition, the non-inverting input is at or very near the reference voltage which ensures that the current through variable resistor 18 and tracking circuit 30 is the reference current. While tracking circuit 30 is responding to counter 28, pre-driver 31 and output driver 32 are responding in the same way so that as tracking circuit reaches the impedance established by the reference current, the output impedance of output driver 32 is also reaching the output impedance that was being provided when the reference current was determined, which is the desired output impedance.

Figure 5:
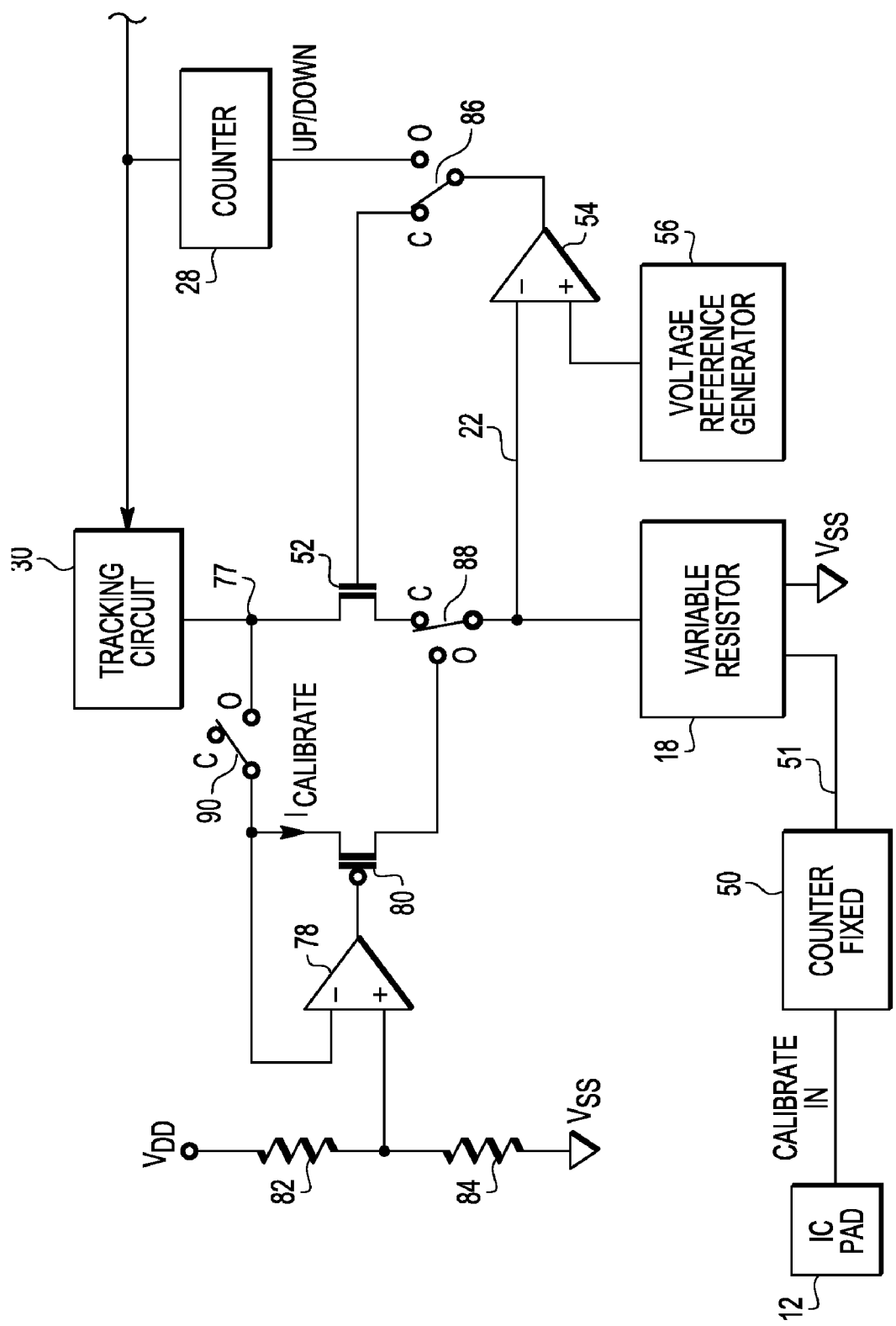
FIG. 5 is a block diagram showing the output driver and calibration circuitry.

Shown in FIG. 5 are the various elements used in the normal mode as shown in FIG. 4 and in calibration mode as shown in FIG. 3 and additional switches 86, 88, and 90 that provide for adding, deleting, and changing connections. Switch 86 switches the output of amplifier 54 from the gate of transistor 52 in the calibration mode to the up/down input of counter 28 in normal mode. Switch 88 switches the current input of variable resistor 18 from the source of transistor 52 in the calibration mode to the drain of transistor 80 in the normal mode. Switch 90 switches the source of transistor 80 from being disconnected in the calibration mode to the current output of tracking circuit 30 in normal mode.

Thus, it is seen that a circuit can have an internal reference, resistors 82 and 84, and still be able to provide the desired output impedance.

By now it should be appreciated that there has been provided a driver circuit in an integrated circuit having selectable output impedance. The driver circuit includes a variable value resistor coupled between a node and a reference voltage terminal. The driver circuit further includes a calibrator circuit having an input coupled to a first integrated circuit pad and an output coupled to the node, the calibrator circuit establishing a predetermined constant voltage at the node. The driver circuit further includes a controlled impedance circuit having an input for receiving data from circuitry within the integrated circuit and an output for providing the data to a second integrated circuit pad of the integrated circuit, the controlled impedance circuit conducting a calibration current determined by the variable value resistor for controlling an output impedance of the driver circuit at the second integrated circuit pad, the controlled impedance circuit varying resistance of the variable value resistor in a calibration mode to select the calibration current which determines a predetermined output impedance at the second integrated circuit pad. The driver circuit may further include switches for reconfiguring the coupling of the controlled impedance circuit from the calibration mode to an operation mode, the controlled impedance circuit comprising a counter, a tracking circuit and an output driver, the counter controlling the tracking circuit in response to a first control signal, a cascode transistor coupled in series between the tracking circuit and the variable value resistor for conducting the calibration current that was selected, and a first comparator coupled to the variable value resistor and to the cascode transistor for providing the first control signal in response to voltage variation at a first current electrode of the cascode transistor. The driver circuit may further comprise a second comparator coupled to the cascode transistor for providing a second control signal in response to voltage variation at a second current electrode of the cascode transistor, the second control signal biasing the cascode transistor. The driver circuit may be further characterized by the tracking circuit further comprising a first plurality of transistors coupled in parallel for providing the calibration current, each transistor of the first plurality of transistors having a control electrode coupled to a count value from the counter, and wherein the output driver comprises a second plurality of transistors coupled in parallel and providing a driver output which is the output for providing the data to the second integrated circuit pad of the integrated circuit, the first plurality of transistors being size ratioed to the second plurality of transistors so that variations in the driver output from process and temperature variations similarly track variations in the tracking circuit. The driver circuit may be further characterized by the first plurality of transistors and second plurality of transistors being size ratioed in accordance with a binary or a thermometer encoding. The driver circuit may be further characterized by the variable value resistor within the integrated circuit comprising a plurality of switched parallel resistors, each of which has a substantially zero temperature coefficient.

Also described is a driver circuit in an integrated circuit having selectable output impedance. The driver circuit includes a calibrated variable value resistor coupled between a node and a reference voltage terminal. The driver circuit further includes a cascode transistor having a first current electrode coupled to the calibrated variable value resistor at the node, a second current electrode and a control electrode. The driver circuit further includes a first comparator having an output coupled to the control electrode of the cascode transistor, a first input coupled to the second current electrode of the cascode transistor, and a second input for receiving a first predetermined voltage. The driver circuit further includes a second comparator having a first input coupled to the node, a second input for receiving a second predetermined voltage, and an output. The driver circuit further includes a controlled impedance circuit having a first input for receiving data from circuitry within the integrated circuit, a second input coupled to the output of the second comparator, a first output coupled to the second current electrode of the cascode transistor, and a second output for providing the data to an integrated circuit pad of the integrated circuit, the controlled impedance circuit providing a calibrated current that is conducted by the cascode transistor and the calibrated variable value resistor for controlling an output impedance of the driver circuit at the integrated circuit pad, the controlled impedance circuit maintaining the calibrated current in response to any voltage and process variation during operation of the driver circuit to maintain a predetermined output impedance at the integrated circuit pad. The driver circuit may be further characterized by the calibrated variable value resistor within the integrated circuit comprises a plurality of switched parallel resistors, each of which has a substantially zero temperature coefficient. The controlled impedance may further comprise a counter having an input which functions as the second input of the controlled impedance circuit and having an output, a tracking circuit having an input coupled to the output of the counter, and an output driver coupled to the output of the counter, the counter controlling the tracking circuit in response to the output of the second comparator. The tracking circuit may further comprise a first plurality of parallel connected transistors coupled between the output of the counter and the first output of the controlled impedance circuit. The output driver may further comprise a second plurality of parallel connected transistors coupled between the output of the counter and the integrated circuit pad, each of the first plurality of parallel connected transistors and the second plurality of parallel connected transistors comprising size ratioed transistors, the first plurality of transistors being size ratioed to the second plurality of transistors so that variations in the output driver from process and temperature similarly track variations in the tracking circuit. The first plurality of transistors and second plurality of transistors may be size ratioed in accordance with a binary or a thermometer encoding.

Describe also is a method. The method includes configuring an integrated circuit to be in a calibration mode of operation to establish a desired output impedance of a driver circuit in the integrated circuit. The method further includes establishing a predetermined constant voltage at a circuit node within the integrated circuit. The method further includes conducting a calibration current through a first transistor connected in series with a variable value resistance in the integrated circuit at the circuit node. The method further includes varying a resistance value of the variable value resistance to establish a value of the calibration current which establishes the desired output impedance of the driver circuit. The predetermined constant voltage at the circuit node within the integrated circuit may be established by coupling a comparator output of a first comparator to a control electrode of the first transistor, coupling a first input of the first comparator to a terminal for providing a first predetermined voltage, coupling a second input of the first comparator to a first current electrode of the first transistor, and receiving the calibration current at a second current electrode of the first transistor. The method may further comprise configuring the integrated circuit to exit the calibration mode of operation and enter a functional mode of operation, using a calibrated resistance value for the variable value resistor during the functional mode of operation, conducting the calibration current as a calibrated current through a second transistor coupled to the circuit node for conducting the calibration current, and correcting any variation of the calibrated current during the functional mode of operation in response to any voltage and process variations to maintain the calibrated current, thereby maintaining a predetermined output impedance of the driver circuit. The method may further comprise changing a count value in response to variations of voltage at the circuit node within the integrated circuit either above or below a voltage reference and tracking the count value and adjusting a value of the calibrated current in response to the count value. The method may further comprise tracking the counting by adjusting a number of a first plurality of parallel-connected transistors which are size ratioed with a second plurality of parallel-connected transistors which form the driver circuit. The method may further comprise size ratioing each of the first plurality of parallel-connected transistors and the second plurality of parallel-connected transistors in accordance with a binary or a thermometer encoding. The method may further comprise using a second comparator having an output coupled to a control electrode of the second transistor, a first input coupled to circuitry for tracking the count value, and a second input coupled to a second predetermined voltage. The method may further comprise implementing the variable value resistor within the integrated circuit with a plurality of switched parallel resistors, each of which has a substantially zero temperature coefficient.

Although the invention is described herein with reference to specific embodiments, various modifications and changes can be made without departing from the scope of the present invention as set forth in the claims below. For example, a single line was drawn serially through the cores from the group controller, this may be achieved with multiple lines or different lines from the group controller. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A driver circuit in an integrated circuit having selectable output impedance, comprising:
   a variable value resistor coupled between a node and a reference voltage terminal;
   a calibrator circuit having an input coupled to a first integrated circuit pad and an output coupled to the node, the calibrator circuit establishing a predetermined constant voltage at the node; and
   a controlled impedance circuit having an input for receiving data from circuitry within the integrated circuit and an output for providing the data to a second integrated circuit pad of the integrated circuit, the controlled impedance circuit conducting a calibration current determined by the variable value resistor for controlling an output impedance of the driver circuit at the second integrated circuit pad, the controlled impedance circuit varying resistance of the variable value resistor in a calibration mode to select the calibration current which determines a predetermined output impedance at the second integrated circuit pad.

2. The driver circuit of claim 1 further comprising:
   switches for reconfiguring coupling of the controlled impedance circuit from the calibration mode to an operation mode, the controlled impedance circuit comprising a counter, a tracking circuit and an output driver, the counter controlling the tracking circuit in response to a first control signal;
   a cascode transistor coupled in series between the tracking circuit and the variable value resistor for conducting the calibration current that was selected; and
   a first comparator coupled to the variable value resistor and to the cascode transistor for providing the first control signal in response to voltage variation at a first current electrode of the cascode transistor.

3. The driver circuit of claim 2 further comprising:
a second comparator coupled to the cascode transistor for providing a second control signal in response to voltage variation at a second current electrode of the cascode transistor, the second control signal biasing the cascode transistor.

4. The driver circuit of claim 2 wherein the tracking circuit further comprises a first plurality of transistors coupled in parallel for providing the calibration current, each transistor of the first plurality of transistors having a control electrode coupled to a count value from the counter, and wherein the output driver comprises a second plurality of transistors coupled in parallel and providing a driver output which is the output for providing the data to the second integrated circuit pad of the integrated circuit, the first plurality of transistors being size ratioed to the second plurality of transistors so that variations in the driver output from process and temperature variations similarly track variations in the tracking circuit.

5. The driver circuit of claim 4 wherein the first plurality of transistors and second plurality of transistors are size ratioed in accordance with a binary or a thermometer encoding.

6. The driver circuit of claim 1 wherein the variable value resistor within the integrated circuit comprises a plurality of switched parallel resistors, each of which has a substantially zero temperature coefficient.

7. A driver circuit in an integrated circuit having selectable output impedance, comprising:
a calibrated variable value resistor coupled between a node and a reference voltage terminal;
a cascode transistor having a first current electrode coupled to the calibrated variable value resistor at the node, a second current electrode and a control electrode;
a first comparator having an output coupled to the control electrode of the cascode transistor, a first input coupled to the second current electrode of the cascode transistor, and a second input for receiving a first predetermined voltage;
a second comparator having a first input coupled to the node, a second input for receiving a second predetermined voltage, and an output; and
a controlled impedance circuit having a first input for receiving data from circuitry within the integrated circuit, a second input coupled to the output of the second comparator, a first output coupled to the second current electrode of the cascode transistor, and a second output for providing the data to an integrated circuit pad of the integrated circuit, the controlled impedance circuit providing a calibrated current that is conducted by the cascode transistor and the calibrated variable value resistor for controlling an output impedance of the driver circuit at the integrated circuit pad, the controlled impedance circuit maintaining the calibrated current in response to any voltage and process variation during operation of the driver circuit to maintain a predetermined output impedance at the integrated circuit pad.

8. The driver circuit of claim 7 wherein the calibrated variable value resistor within the integrated circuit comprises a plurality of switched parallel resistors, each of which has a substantially zero temperature coefficient.

9. The driver circuit of claim 7 wherein the controlled impedance circuit further comprises:
a counter having an input which functions as the second input of the controlled impedance circuit and having an output;
a tracking circuit having an input coupled to the output of the counter; and
an output driver coupled to the output of the counter, the counter controlling the tracking circuit in response to the output of the second comparator.

10. The driver circuit of claim 9 wherein the tracking circuit further comprises:
a first plurality of parallel connected transistors coupled between the output of the counter and the first output of the controlled impedance circuit.

11. The driver circuit of claim 10 wherein the output driver further comprises:
a second plurality of parallel connected transistors coupled between the output of the counter and the integrated circuit pad, each of the first plurality of parallel connected transistors and the second plurality of parallel connected transistors comprising size ratioed transistors, the first plurality of transistors being size ratioed to the second plurality of transistors so that variations in the output driver from process and temperature similarly track variations in the tracking circuit.

12. The driver circuit of claim 11 wherein the first plurality of parallel connected transistors and second plurality of parallel connected transistors are size ratioed in accordance with a binary or a thermometer encoding.

13. A method comprising:
configuring an integrated circuit to be in a calibration mode of operation to establish a desired output impedance of a driver circuit in the integrated circuit;
establishing a predetermined constant voltage at a circuit node within the integrated circuit;
conducting a calibration current through a first transistor connected in series with a variable value resistance in the integrated circuit at the circuit node; and
varying a resistance value of the variable value resistance to establish a value of the calibration current which establishes the desired output impedance of the driver circuit.

14. The method of claim 13 wherein the predetermined constant voltage at the circuit node within the integrated circuit is established by:
coupling a comparator output of a first comparator to a control electrode of the first transistor;
coupling a first input of the first comparator to a terminal for providing a first predetermined voltage;
coupling a second input of the first comparator to a first current electrode of the first transistor; and
receiving the calibration current at a second current electrode of the first transistor.

15. The method of claim 14 further comprising:
configuring the integrated circuit to exit the calibration mode of operation and enter a functional mode of operation;
using a calibrated resistance value for the variable value resistance during the functional mode of operation;
conducting the calibration current as a calibrated current through a second transistor coupled to the circuit node for conducting the calibration current; and
correcting any variation of the calibrated current during the functional mode of operation in response to any voltage and process variations to maintain the calibrated current, thereby maintaining a predetermined output impedance of the driver circuit.

16. The method of claim 15 further comprising
changing a count value in response to variations of voltage at the circuit node within the integrated circuit either above or below a voltage reference;

tracking the count value and adjusting a value of the calibrated current in response to the count value.

17. The method of claim 16 wherein:
the tracking the count value is by adjusting a number of a first plurality of parallel-connected transistors which are size ratioed with a second plurality of parallel-connected transistors which form the driver circuit.

18. The method of claim 17 further comprising:
size ratioing each of the first plurality of parallel-connected transistors and the second plurality of parallel-connected transistors in accordance with a binary or a thermometer encoding.

19. The method of claim 16 further comprising:
using a second comparator having an output coupled to a control electrode of the second transistor, a first input coupled to circuitry for tracking the count value, and a second input coupled to a second predetermined voltage.

20. The method of claim 13 further comprising:
implementing the variable value resistance within the integrated circuit with a plurality of switched parallel resistors, each of which has a substantially zero temperature coefficient.

* * * * *